US008098835B2

(12) United States Patent
Moon et al.

(10) Patent No.: US 8,098,835 B2
(45) Date of Patent: Jan. 17, 2012

(54) METHOD AND APPARATUS TO ENHANCE LOW FREQUENCY COMPONENT OF AUDIO SIGNAL BY CALCULATING FUNDAMENTAL FREQUENCY OF AUDIO SIGNAL

(75) Inventors: Han-gil Moon, Seoul (KR); Manish Arora, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1320 days.

(21) Appl. No.: 11/697,382

(22) Filed: Apr. 6, 2007

(65) Prior Publication Data

US 2008/0118084 A1 May 22, 2008

(30) Foreign Application Priority Data

Nov. 22, 2006 (KR) ............................ 2006-0116069

(51) Int. Cl.
*H03G 3/00* (2006.01)
*H03G 5/00* (2006.01)

(52) U.S. Cl. ........................................... 381/61; 381/98

(58) Field of Classification Search .................... 381/59, 381/96, 61, 98, 101, 102, 103
See application file for complete search history.

(56) References Cited

U.S. PATENT DOCUMENTS 6,111,960 A * 8/2000 Aarts et al. ...................... 381/61
6,606,388 B1 8/2003 Townsend et al.
6,763,246 B2 * 7/2004 Mousty et al. ............ 455/550.1
7,747,027 B2 * 6/2010 Asada .......................... 381/101
2003/0044023 A1 * 3/2003 Larsen ............................ 381/61
2004/0071297 A1 * 4/2004 Katou et al. .................... 381/61
2006/0159283 A1 * 7/2006 Mathew et al. ................. 381/98
2007/0140511 A1 * 6/2007 Lin et al. ......................... 381/98

FOREIGN PATENT DOCUMENTS

CN 1801611 7/2006
KR 2002-43617 6/2002

OTHER PUBLICATIONS

Chinese Office Action issued Dec. 11, 2009 in CN Application No. 2007101095901.

* cited by examiner

*Primary Examiner* — Xu Mei
(74) *Attorney, Agent, or Firm* — Stanzione & Kim, LLP

(57) ABSTRACT

A method and apparatus to enhance a low frequency component of an audio signal, by computing a fundamental frequency of an input audio signal using the input audio signal and a delayed audio signal obtained by delaying the input audio signal by a predetermined amount of time, generating harmonic signals from the input audio signal based on the fundamental frequency, and combining the harmonic signals and the input audio signal. The low frequency component of the audio signal can be enhanced using human characteristics of perception without physically boosting the energy of the low frequency component.

13 Claims, 8 Drawing Sheets

METHOD AND APPARATUS TO ENHANCE LOW FREQUENCY COMPONENT OF AUDIO SIGNAL BY CALCULATING FUNDAMENTAL FREQUENCY OF AUDIO SIGNAL

CROSS-REFERENCE TO RELATED APPLICATIONS

This application claims priority under 35 U.S.C. §119(a) from Korean Patent Application No. 10-2006-0116069, filed on Nov. 22, 2006, in the Korean Intellectual Property Office, the disclosure of which is incorporated herein in its entirety by reference.

BACKGROUND OF THE INVENTION

1. Field of the Invention

The present general inventive concept relates to a method and apparatus to enhance a low frequency component of an audio signal.

2. Description of the Related Art

It is difficult for small-sized speakers in portable devices, such as laptop computers and MP3 players, to completely reproduce a low frequency component of an audio signal due to physical limitations, i.e., small size. The difficulty of complete reproduction of a low frequency component of an audio signal may reduce the sound quality of the audio signal. Various methods have been suggested to address this side effect.

FIG. 1 is a block diagram of a conventional apparatus to enhance a low frequency component of an audio signal.

Referring to FIG. 1, the conventional apparatus includes low pass filters 110, a sine function generation module 122, a cosine function generation module 124, band pass filters 130, and mixers 140.

Once an audio signal is input to the conventional apparatus of FIG. 1, each of the low pass filters 110 extracts only a low frequency component (e.g. equal to or less than 120 Hz) by performing low pass filtering of the audio signal input with respect to a corresponding channel.

Both the sine function generation module 122 and the cosine function generation module 124 generate a harmonic signal by modulating the low-pass filtered signal.

The band pass filters 130 select only specific order harmonic signals by respectively performing band pass filtering of the signals modulated using a sine function and a cosine function.

Each of the mixers 140 generates an audio signal of a corresponding channel, in which a low frequency component is enhanced, by combining the input audio signal and the harmonic signal selected by a corresponding band pass filter 130.

As described above, a method of enhancing a low frequency component using a harmonic signal uses an acoustical effect that if human ears hear a tone of a frequency having multiples of a fundamental frequency, the person perceives the tone as if hearing a tone corresponding to the fundamental frequency.

FIG. 2 is a diagram illustrating ideal harmonic signals used to enhance a low frequency component of an audio signal.

Referring to FIG. 2, a fundamental frequency component of 220 Hz and harmonic signals are illustrated. As illustrated in FIG. 2, if a fundamental frequency component is 220 Hz, harmonic signals having multiples of 220 Hz, i.e., 440 Hz, 660 Hz, 880 Hz, and so on, are ideal harmonic signals to be used to enhance a low frequency component of an audio signal. Accordingly, the amplitude of each of the ideal harmonic signals decreases if their frequency increases as illustrated in FIG. 2.

If a person hears a tone of each of the ideal harmonic signals, the person perceives the tone as if hearing a tone corresponding to 220 Hz. Thus, using the ideal harmonic signals, the amplitude of a sound having a tone corresponding to 220 Hz seems to be enhanced.

However, conventional apparatuses to enhance a low frequency component of an audio signal cannot generate ideal harmonic signals as illustrated in FIG. 2.

FIG. 3 is a diagram illustrating harmonic signals generated using the conventional apparatus of FIG. 1.

FIG. 3 shows a fundamental frequency component that is 220 Hz and harmonic signals of 450 Hz, 650 Hz, and 900 Hz, wherein a modulation frequency is 50 Hz.

Referring to FIG. 3, since the modulation frequency used to generate harmonic signals is fixed to a pre-set frequency (e.g. 50 Hz), the conventional apparatus cannot generate the ideal harmonic signals of 440 Hz, 660 Hz, and 880 Hz illustrated in FIG. 2, but generates harmonic signals having errors, such as harmonic signals of 450 Hz, 650 Hz, and 900 Hz. In addition, unlike the ideal harmonic signals illustrated in FIG. 2 of which the amplitude decreases gradually, the harmonic signals illustrated in FIG. 3 maintain the same amplitude over all the frequencies.

As described above, a conventional method of enhancing a low frequency component of an audio signal has errors in terms of frequencies of harmonic signals as compared to ideal harmonic signals, and causes a severe variation in a tone since the same amplitude of harmonic signals is maintained instead of decreasing the amplitudes of the harmonic signals as the frequency of the harmonic signals are increased.

SUMMARY OF THE INVENTION

The present general inventive concept provides a method and apparatus to enhance a low frequency component of an audio signal using human characteristics of perception without physically boosting energy of the low frequency component by calculating and using a fundamental frequency of the audio signal.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a method of enhancing a low frequency component of an audio signal, the method including computing a fundamental frequency of an input audio signal using the input audio signal and a delayed audio signal obtained by delaying the input audio signal by a predetermined amount of time, generating harmonic signals from the input audio signal based on the fundamental frequency, and combining the harmonic signals and the input audio signal.

The computing of the fundamental frequency of the input audio signal may also include performing low pass filtering of the input audio signal, and calculating the fundamental frequency of the input audio signal using a maximum cross-correlation value between the low-pass filtered audio signal and the delayed audio signal.

The calculating of the fundamental frequency of the input audio signal may also include calculating a delay time of the delayed audio signal when the maximum cross-correlation value between the low-pass filtered audio signal and the delayed audio signal is obtained and converting the delay time to a frequency.

The generating of the harmonic signals may also include performing band pass filtering of the input audio signal after setting the fundamental frequency as a center frequency and modulating the band-pass filtered audio signal.

The modulating of the band-pass filtered audio signal may also include modulating the band-pass filtered audio signal using a Single-sideband (SSB) modulation.

The input audio signal may also be a high-pass filtered audio signal.

The method may further include adjusting amplitudes of the harmonic signals.

The foregoing and/or other aspects and utilities of the present general inventive concept may also be achieved by providing an apparatus to enhance a low frequency component of an audio signal, the apparatus comprising: a fundamental frequency calculator to calculate a fundamental frequency of an input audio signal using the input audio signal and a delayed audio signal obtained by delaying the input audio signal by a predetermined amount of time, a harmonic signal generator to generate harmonic signals from the input audio signal based on the fundamental frequency; and a signal combiner to combine the harmonic signals and the input audio signal.

The fundamental frequency calculator may also include a low pass filter to perform low pass filtering of the input audio signal and a frequency calculator to calculate the fundamental frequency of the input audio signal using a maximum cross-correlation value between the low-pass filtered audio signal and the delayed audio signal.

The frequency calculator may also include a delay time calculator calculating a delay time of the delayed audio signal when the maximum cross-correlation value between the low-pass filtered audio signal and the delayed audio signal is obtained and a time-frequency converter converting the delay time to a frequency.

The harmonic signal generator may also include a band pass filter to perform band pass filtering of the input audio signal by setting the fundamental frequency as a center frequency and a modulator to modulate the band-pass filtered audio signal.

The modulator may modulate the band-pass filtered audio signal using a Single-sideband (SSB) modulation.

The apparatus may further include a high pass filter to perform high pass filtering of the audio signal before the audio signal is input to the fundamental frequency calculator.

The apparatus may further include a harmonic signal adjuster to adjust amplitudes of the harmonic signals.

The foregoing and/or other aspects and utilities of the present general inventive concept may also be achieved by providing a computer readable recording medium containing computer readable codes to perform a method of enhancing a low frequency component of an audio signal, the method including computing a fundamental frequency of an input audio signal using the input audio signal and a delayed audio signal obtained by delaying the input audio signal by a predetermined amount of time generating harmonic signals from the input audio signal based on the fundamental frequency and combining the harmonic signals and the input audio signal.

The foregoing and/or other aspects and utilities of the present general inventive concept may also be achieved by providing a method of calculating a fundamental frequency of an audio signal, the method including performing low pass filtering of the audio signal, calculating a delay time of the delayed audio signal corresponding to a maximum cross-correlation value between the low-pass filtered audio signal and the delayed audio signal; and converting the delay time to the fundamental frequency.

The foregoing and/or other aspects and utilities of the present general inventive concept may also be achieved by providing an apparatus to calculate a fundamental frequency of an audio signal including a low pass filter to perform low pass filtering of the audio signal, a delay time calculator to calculate a delay time of the delayed audio signal corresponding to a maximum cross-correlation value between the low-pass filtered audio signal and a delayed audio signal obtained by delaying the audio signal by a predetermined amount of time, and a time-frequency converter to convert the delay time to the fundamental frequency.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
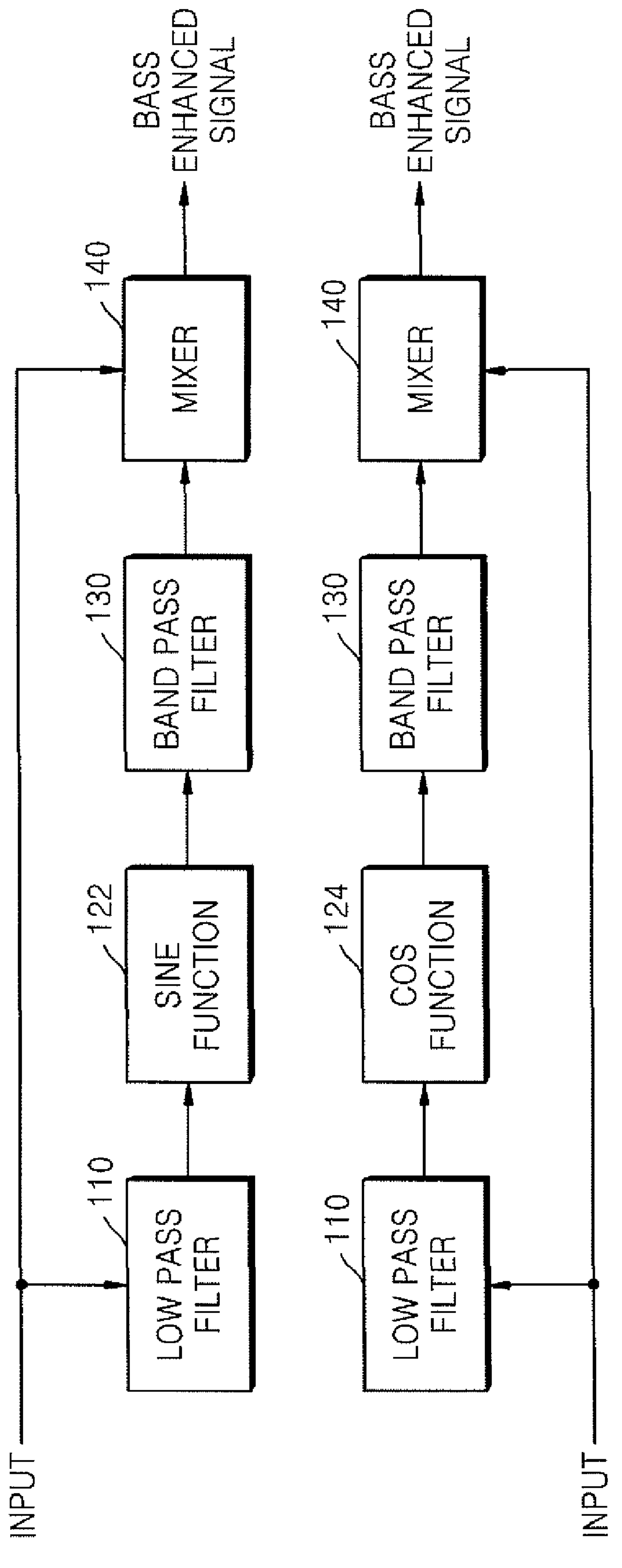
FIG. 1 (PRIOR ART)
FIG. 1 is a block diagram of a conventional apparatus to enhance a low frequency component of an audio signal.
Figure 2:
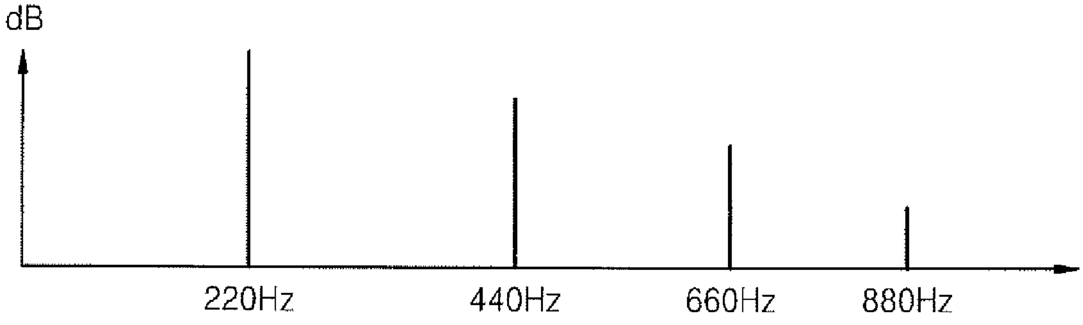
FIG. 2 (PRIOR ART)
FIG. 2 is a diagram illustrating ideal harmonic signals used to enhance a low frequency component of an audio signal.
Figure 3:
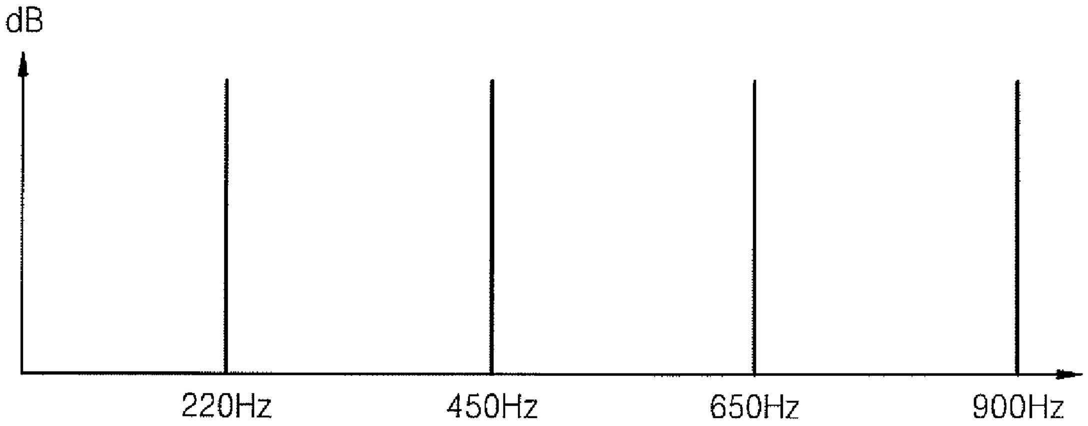
FIG. 3 (PRIOR ART)
FIG. 3 is a diagram illustrating harmonic signals generated using the conventional apparatus of FIG. 1.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 4:
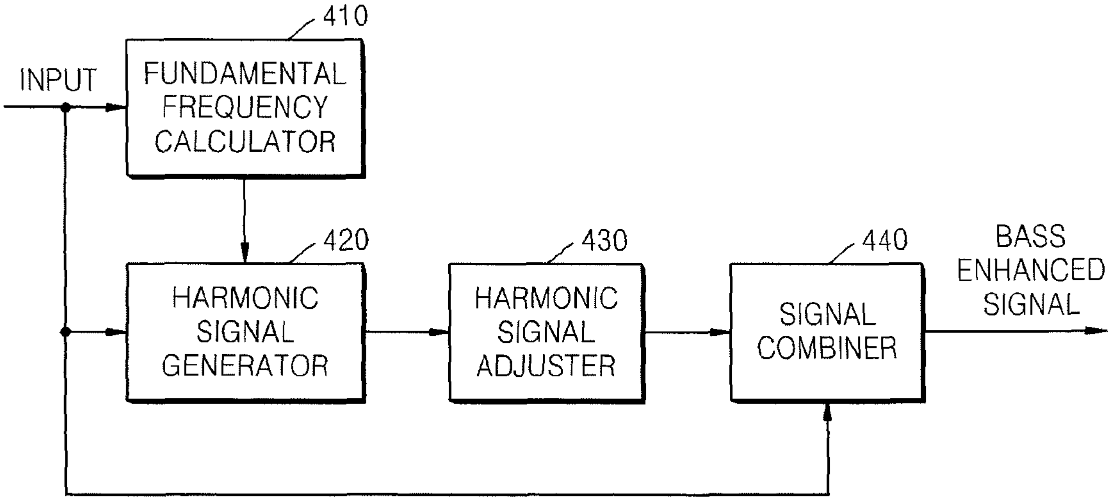
FIG. 4 is a block diagram illustrating an apparatus to enhance a low frequency component of an audio signal according to an embodiment of the present general inventive concept.

FIG. 4 is a block diagram of an apparatus to enhance a low frequency component of an audio signal according to an embodiment of the present general inventive concept.

Referring to FIG. 4, the apparatus includes a fundamental frequency calculator 410, a harmonic signal generator 420, a harmonic signal adjuster 430, and a signal combiner 440.

The fundamental frequency calculator 410 calculates a fundamental frequency of an input audio signal using the input audio signal and a delayed audio signal obtained by delaying the input audio signal by a predetermined amount of time.

The harmonic signal generator 420 generates harmonic signals from the input audio signal based on the fundamental frequency calculated by the fundamental frequency calculator 410. The harmonic signal adjuster 430 adjusts the amplitude of the harmonic signals generated by the harmonic signal generator 420.

The signal combiner 440 enhances a low frequency component of the input audio signal by combining the harmonic signals and the input audio signal.

Figure 5:
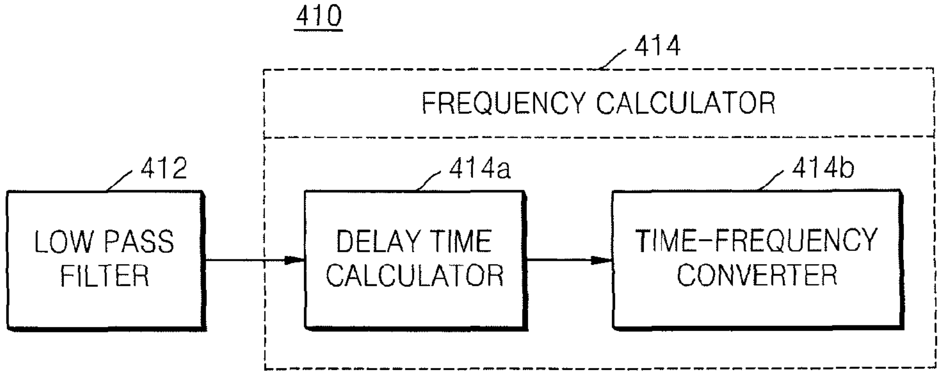
FIG. 5 is a block diagram illustrating a fundamental frequency calculator of FIG. 4, according to an embodiment of the present general inventive concept.

FIG. 5 is a block diagram of the fundamental frequency calculator 410 of FIG. 4, according to an embodiment of the present general inventive concept.

Referring to FIG. 5, the fundamental frequency calculator 410 includes a low pass filter 412 and a frequency calculator 414.

The low pass filter 412 performs low pass filtering of the input audio signal. For example, the low pass filter 412 can perform low pass filtering of the input audio signal by setting a cut-off frequency to 120 Hz. However, the cut-off frequency of the low pass filter 412 can vary according to the implementation.

The frequency calculator 414 includes a delay time calculator 414*a* and a time-frequency converter 414*b*.

The delay time calculator 414*a* calculates a delay time of a delayed audio signal when the maximum cross-correlation value between the low-pass filtered audio signal and the delayed audio signal is obtained. The cross-correlation value indicates the grade of similarity between different signals. That is, the cross-correlation value increases if the similarity between different signals increases.

Figure 6:
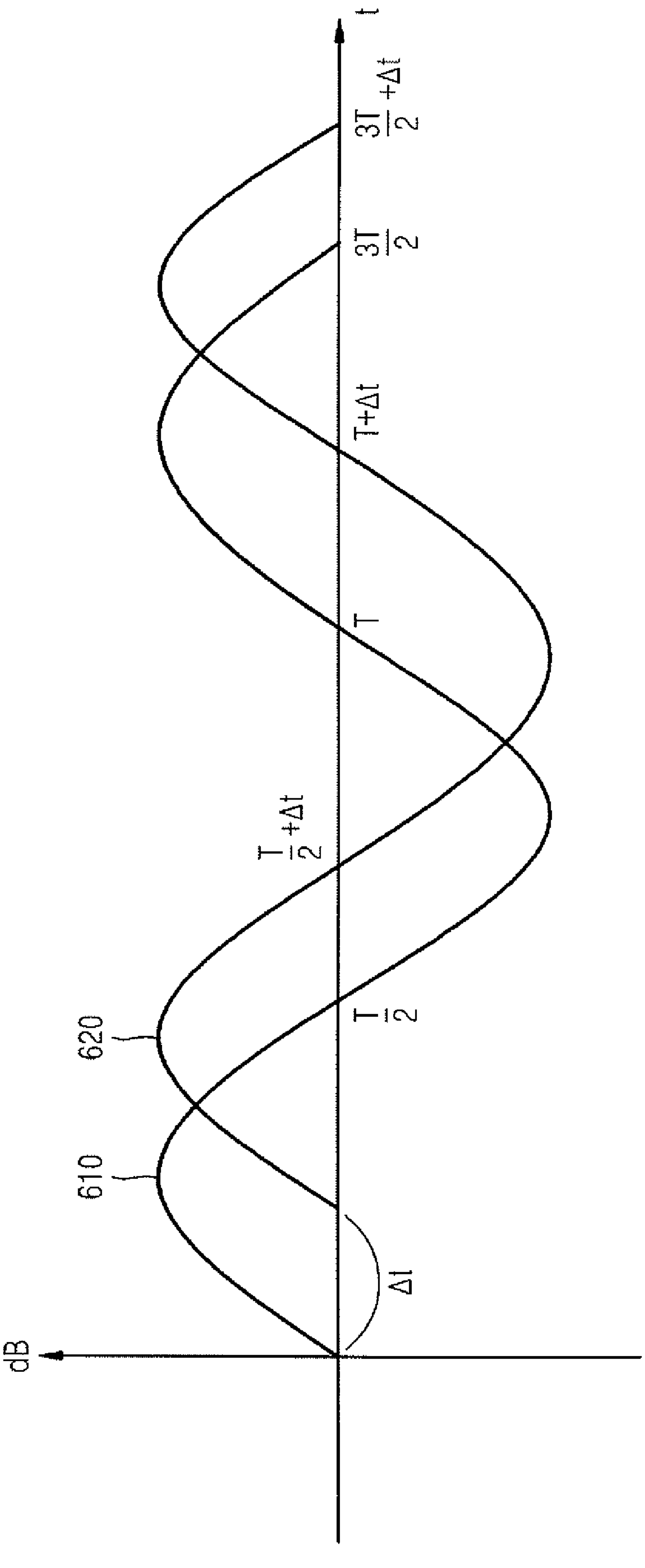
FIG. 6 is a graph to describe operations of a time delay calculator of FIG. 5, according to an embodiment of the present general inventive concept.

FIG. 6 is a graph to describe the time delay calculator 414*a* of FIG. 5, according to an embodiment of the present general inventive concept.

In FIG. 6, for example, a first signal 610 can be the input audio signal and a second signal 620 can be the delayed audio signal. Referring to FIG. 6, the first signal 610 has a period of T, and the second signal 620 is delayed from the first signal 610 by an amount $\Delta t$.

In an embodiment of the present general inventive concept, the time delay calculator 414*a*, as illustrated in FIG. 5, determines the value of $\Delta t$ where a cross-correlation value between the first signal 610 and the second signal 620 is the greatest while $\Delta t$ is changing.

Where a cross-correlation value between the first signal 610 and the second signal 620 is greatest where the signals 610 and 620 have the same period in the time domain and the energy of a cross-correlation value between the first signal 610 and the second signal 620 is greatest in the frequency domain, and the signals 610 and 620 have a frequency where a cross-correlation value between the first signal 610 and the second signal 620 is greatest is the fundamental frequency.

The time-frequency converter 414*b* converts the delay time calculated by the time delay calculator 414*a* to a frequency.

Accordingly, the time-frequency converter 414*b* can convert the delay time to a frequency based on a sampling rate of the input audio signal as illustrated in Equation 1 below.

$$f = \frac{fs}{\left(\frac{fs}{100} + tx - 1\right)} \quad (1)$$

Here, f denotes a frequency, $f_S$ denotes a sampling rate, and tx denotes a delay value at which a cross-correlation value is greatest from among a set of delay values having a conversion relationship with the delay time as illustrated in Equation 2 below.

$$t = \frac{tx}{fs} \quad (2)$$

For example, the set of delay values can be determined as illustrated in Equation 3 below.

$$\left[\frac{fs}{100}, \frac{fs}{100} + 1, \frac{fs}{100} + 2, \ldots, \frac{fs}{20}\right] \quad (3)$$

If the sampling rate is 44100 Hz, the set of delay values contains delay values of 441 Hz through 2205 Hz, and when the delay values are converted to delay times in the time domain using Equation 2, the delay times are 0.01 seconds through 0.05 seconds.

Thus, by calculating a delay time, for example, where a cross-correlation value is the greatest while changing t from 0.01 seconds to 0.05 seconds, converting the delay time to a delay value using Equation 2, and substituting the delay value into Equation 1, a frequency, i.e., the fundamental frequency, corresponding to the delay time of the case where a cross-correlation value is greatest, can be obtained.

Figure 7:
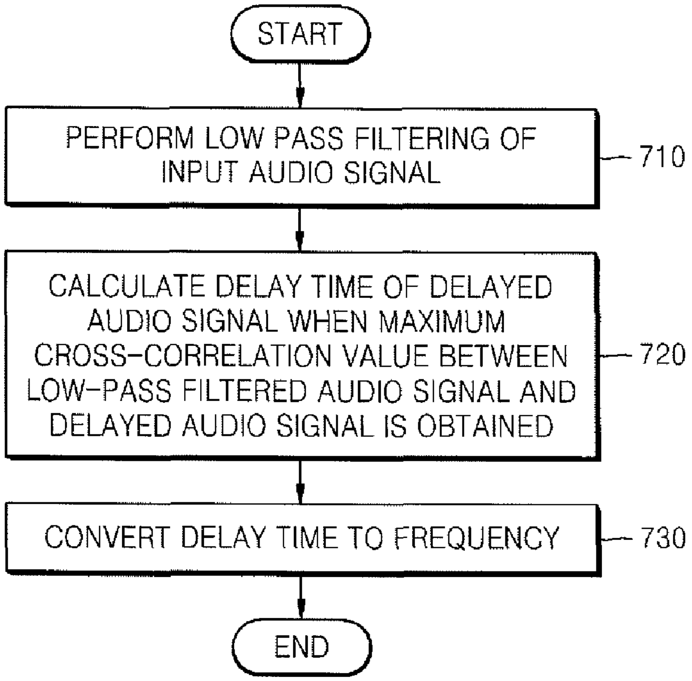
FIG. 7 is a flowchart illustrating a method of calculating a fundamental frequency according to an embodiment of the present general inventive concept.

FIG. 7 is a flowchart illustrating a method of calculating a fundamental frequency according to an embodiment of the present general inventive concept.

Referring to FIG. 7, low pass filtering of an input audio signal is performed in operation 710.

A delay time of a delayed audio signal obtained by delaying the input audio signal by a predetermined time is calculated in operation 720 when the maximum cross-correlation value between the low-pass filtered audio signal and the delayed audio signal is obtained.

The delay time is converted to a frequency in operation 730.

As described above, when the fundamental frequency calculator 410 calculates the fundamental frequency, the harmonic signal generator 420 generates harmonic signals from the input audio signal based on the fundamental frequency.

Figure 8:
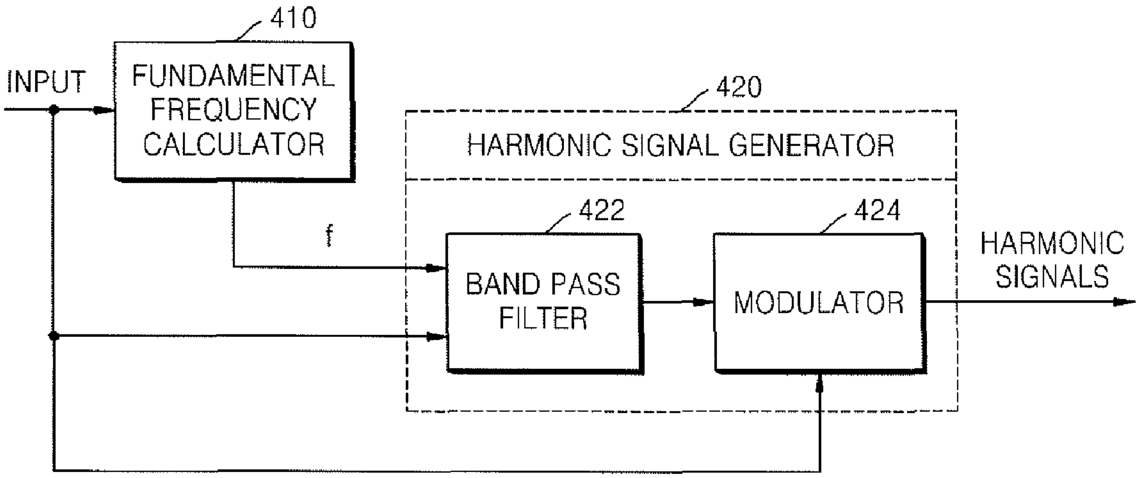
FIG. 8 is a block diagram illustrating a harmonic signal generator of FIG. 4, according to an embodiment of the present general inventive concept.

FIG. 8 is a block diagram illustrating the harmonic signal generator 420 of FIG. 4, according to an embodiment of the present general inventive concept.

Referring to FIG. 8, the harmonic signal generator 420 includes a band pass filter 422 and a modulator 424. However, for a more complete description, the fundamental frequency calculator 410 is additionally illustrated.

The band pass filter 422 performs band pass filtering of the input audio signal after setting the fundamental frequency calculated by the fundamental frequency calculator 410 as a center frequency. For example, if the fundamental frequency of the input audio signal calculated by the fundamental frequency calculator 410 is 220 Hz, the band pass filter 422 performs band pass filtering of the input audio signal with a predetermined bandwidth setting the center frequency to 220 Hz.

Referring to FIG. 8, the modulator 424 generates harmonic signals by modulating the band-pass filtered audio signal. The modulator 424 may modulate the band-pass filtered audio signal using, for example, a Single-sideband (SSB) modulation method. The SSB modulation method indicates that only one of any of upper and lower sideband signals generated by Amplitude Modulation (AM) is used and has advantages in that an occupied frequency bandwidth is reduced by a half and power consumption is reduced since transmission power does not have to be high, as compared to other modulation methods.

However, the modulation method used in an embodiment of the present general inventive concept is not limited to the SSB modulation method, and various modulation methods in which harmonic signals can be generated can be used.

As described above, when the harmonic signal generator 420 generates harmonic signals, the harmonic signal adjuster 430, as illustrated in FIG. 4, adjusts the amplitude of the harmonic signals generated by the harmonic signal generator 420. If the input audio signal and the harmonic signals are combined when the harmonic signals have excessive energy, the tone of the audio signal may be changed. Thus, in order to minimize the change in tone, the amplitude of the harmonic signals is adjusted.

Figure 9:
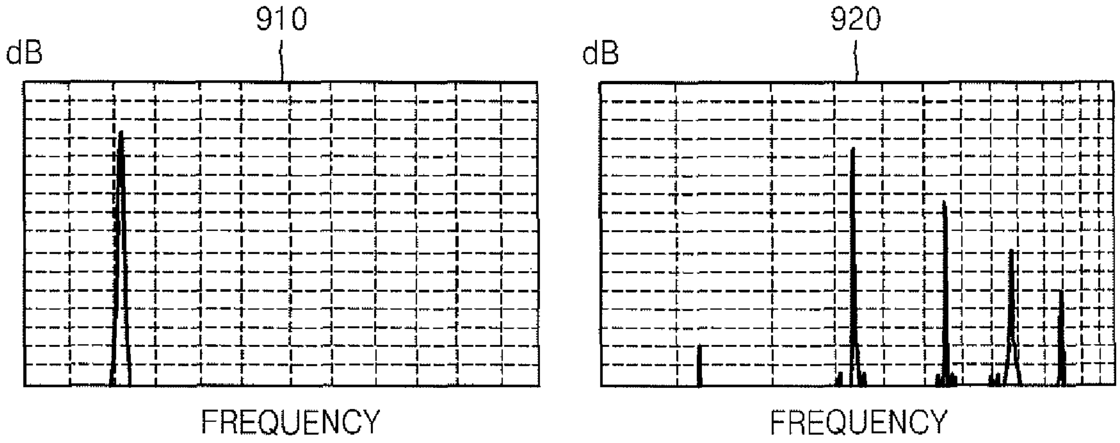
FIG. 9 is a diagram illustrating harmonic signals generated according to an embodiment of the present general inventive concept.

FIG. 9 is a diagram to describe harmonic signals generated according to an embodiment of the present general inventive concept.

Referring to FIG. 9, a graph 910 of a first signal shows a fundamental frequency of an input audio signal, and a graph 920 of a second signal shows harmonic signals used to enhance a low frequency component of the first signal, which are generated according to an embodiment of the present general inventive concept. In the graph 920 of the second signal, the fundamental frequency has a very small amplitude, i.e., an insignificant amplitude compared to the harmonic signals. This indicates that when an audio signal is output from a small-sized device, such as a miniature speaker, a level of sound, i.e., energy, of a low frequency component is low. In addition, 4 harmonic signals are illustrated in the graph 920 of the second signal, wherein frequencies of the 4 harmonic signals are multiples of the fundamental frequency, and the amplitude of the 4 harmonic signals decreases when their frequency increases.

As described above, when the harmonic signal adjuster 430, illustrated in FIG. 4, generates the amplitude adjusted harmonic signals, the signal combiner 440 enhances the low frequency component of the input audio signal by combining the amplitude adjusted harmonic signals and the input audio signal.

Figure 10:
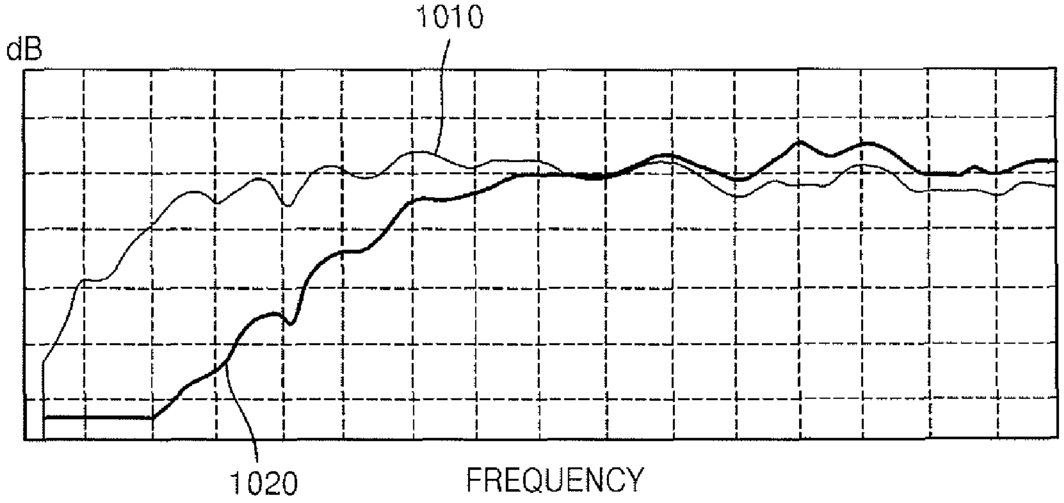
FIG. 10 illustrates a low frequency component enhanced audio signal generated by using a method of enhancing a low frequency component of an audio signal according to an embodiment of the present general inventive concept.

FIG. 10 illustrates a low frequency component enhanced audio signal generated by using a method of enhancing a low frequency component of an audio signal according to an embodiment of the present general inventive concept.

Referring to FIG. 10, a first signal 1010 indicates an input audio signal, and a second signal 1020 indicates a low frequency component enhanced audio signal.

As illustrated in FIG. 10, a flat region exists at the left end of the graph of the second signal 1020, and the flat region indicates that high pass filtering is performed with respect to an audio signal before the audio signal is input in order to prevent excessive energy from being unnecessarily concentrated in a low frequency band of the audio signal by canceling a signal of a band which is not reproduced when the audio signal is reproduced.

Accordingly, in order to obtain the graph of the second signal 1020, the process described below is performed.

A band which is not reproduced, when the audio signal is reproduced, is cancelled by performing high pass filtering of the audio signal, inputting the high-pass filtered audio signal, for example, to a fundamental frequency calculator 410, a fundamental frequency of the high-pass filtered audio signal is calculated, and harmonic signals are generated based on the fundamental frequency.

Thereafter, by combining the harmonic signals and the high-pass filtered audio signal, a low frequency component enhanced audio signal, such as the second signal 1020, can be obtained.

In FIG. 10, although the second signal 1020 still has a small low frequency component compared to the first signal 1010, since the second signal 1020 has been enhanced using the method of enhancing a low frequency component of an audio signal according to an embodiment of the present general inventive concept, a listener can hear an audio signal having sound quality similar to that of the input audio signal according to the above-described acoustic effect.

Figure 11:
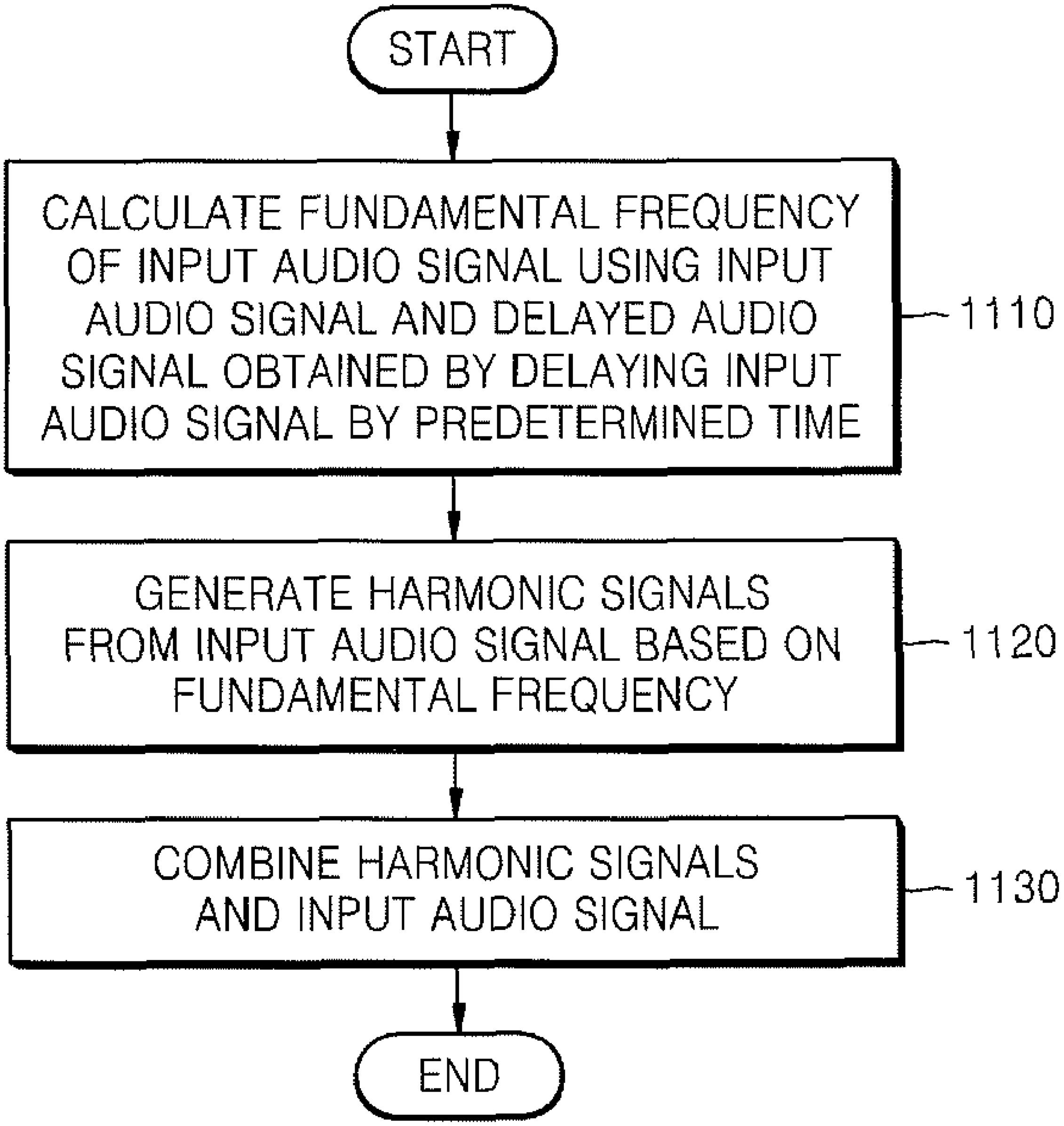
FIG. 11 is a flowchart illustrating a method of enhancing a low frequency component of an audio signal according to an embodiment of the present general inventive concept.

FIG. 11 is a flowchart illustrating a method of enhancing a low frequency component of an audio signal according to an embodiment of the present general inventive concept.

Referring to FIG. 11, a fundamental frequency of an input audio signal is calculated in operation 1110 using the input audio signal and a delayed audio signal obtained by delaying the input audio signal by a predetermined amount of time.

Harmonic signals are generated from the input audio signal based on the fundamental frequency calculated in operation 1120.

The harmonic signals are combined with the input audio signal in operation 1130.

Figure 12:
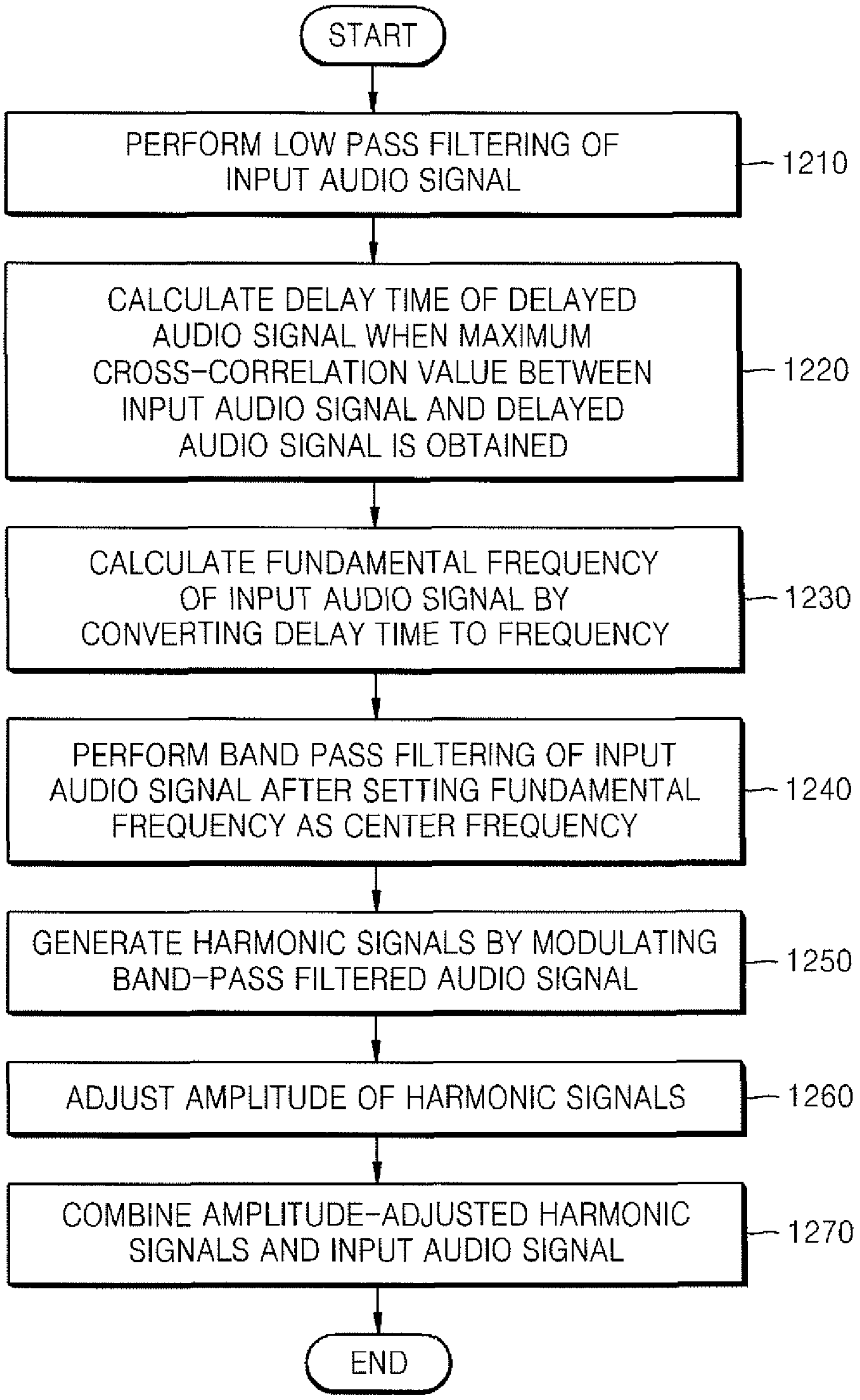
FIG. 12 is a flowchart further illustrating a method in an embodiment of the present general inventive concept in accordance with the method of FIG. 11.

FIG. 12 is a flowchart further illustrating a method in accordance with the method illustrated in FIG. 11, according to an embodiment of the present general inventive concept.

Referring to FIG. 12, low pass filtering of the input audio signal is performed in operation 1210. As described above, when an audio signal is input, a low frequency component may be removed by performing high pass filtering of the audio signal.

In operation 1220, a delay time of the delayed audio signal is calculated when the maximum cross-correlation value between the low-pass filtered audio signal and the delayed audio signal is obtained.

In operation 1230, the fundamental frequency of the input audio signal is calculated by converting the delay time to a frequency.

In operation 1240, band pass filtering of the input audio signal is performed by setting the fundamental frequency as a center frequency.

In operation 1250, harmonic signals are generated by modulating the band-pass filtered audio signal.

In operation 1260, the amplitude of the harmonic signals is adjusted.

In operation 1270, the amplitude-adjusted harmonic signals are combined with the input audio signal.

The general inventive concept can also be embodied as computer readable codes on a computer readable recording medium. The computer readable recording medium is any data storage device that can store data that can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer-readable recording medium can also be distributed over network-coupled computer systems so that the computer-readable code is stored and executed in a distributed fashion. Also, functional programs, codes, and code segments to accomplish the present general inventive concept can be easily construed by programmers skilled in the art to which the present general inventive concept pertains.

As described above, according to the present general inventive concept, a low frequency component of an audio signal can be enhanced by using human characteristics of perception without physically boosting energy of the low frequency component.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of enhancing a low frequency component of an audio signal, the method comprising:
- computing a fundamental frequency of an input audio signal using the input audio signal and a delayed audio signal obtained by delaying the input audio signal by a predetermined amount of time;
- generating harmonic signals from the input audio signal based on the fundamental frequency; and
- combining the harmonic signals and the input audio signal,
- wherein the computing of the fundamental frequency of the input audio signal comprises
  - performing low pass filtering of the input audio signal; and
  - calculating the fundamental frequency of the input audio signal using a maximum cross-correlation value between the low-pass filtered audio signal and the delayed audio signal.

2. The method of claim 1, wherein the calculating of the fundamental frequency of the input audio signal comprises:
- calculating a delay time of the delayed audio signal when the maximum cross-correlation value between the low-pass filtered audio signal and the delayed audio signal is obtained; and
- converting the delay time to a frequency.

3. The method of claim 1, wherein the generating of the harmonic signals comprises:
- performing band pass filtering of the input audio signal after setting the fundamental frequency as a center frequency; and
- modulating the band-pass filtered audio signal.

4. The method of claim 3, wherein the modulating of the band-pass filtered audio signal comprises modulating the band-pass filtered audio signal using a Single-sideband (SSB) modulation.

5. The method of claim 1, wherein the input audio signal is a high-pass filtered audio signal.

6. The method of claim 1, further comprising adjusting amplitudes of the harmonic signals.

7. An apparatus to enhance a low frequency component of an audio signal, the apparatus comprising:
- a fundamental frequency calculator to calculate a fundamental frequency of an input audio signal using the input audio signal and a delayed audio signal obtained by delaying the input audio signal by a predetermined amount of time;
- a harmonic signal generator to generate harmonic signals from the input audio signal based on the fundamental frequency; and
- a signal combiner to combine the harmonic signals and the input audio signal,
- wherein the fundamental frequency calculator comprises:
  - a low pass filter to perform low pass filtering of the input audio signal; and
  - a frequency calculator to calculate the fundamental frequency of the input audio signal using a maximum cross-correlation value between the low-pass filtered audio signal and the delayed audio signal.

8. The apparatus of claim 7, wherein the frequency calculator comprises:
- a delay time calculator calculating a delay time of the delayed audio signal when the maximum cross-correlation value between the low-pass filtered audio signal and the delayed audio signal is obtained; and
- a time-frequency converter converting the delay time to a frequency.

9. The apparatus of claim 7, wherein the harmonic signal generator comprises:
- a band pass filter to perform band pass filtering of the input audio signal after setting the fundamental frequency as a center frequency; and
- a modulator to modulate the band-pass filtered audio signal.

10. The apparatus of claim 9, wherein the modulator modulates the band-pass filtered audio signal using a Single-sideband (SSB) modulation.

11. The apparatus of claim 7, further comprising a high pass filter to perform high pass filtering of the audio signal before the audio signal is input to the fundamental frequency calculator.

12. The apparatus of claim 7, further comprising a harmonic signal adjuster to adjust amplitudes of the harmonic signals.

13. A non-transitory computer readable recording medium containing computer readable codes executable by a control module to perform a method of enhancing a low frequency component of an audio signal, the method comprising:
- computing a fundamental frequency of an input audio signal using the input audio signal and a delayed audio signal obtained by delaying the input audio signal by a predetermined amount of time;
- generating harmonic signals from the input audio signal based on the fundamental frequency; and
- combining the harmonic signals and the input audio signal,
- wherein the computing of the fundamental frequency of the input audio signal comprises
  - performing low pass filtering of the input audio signal; and
  - calculating the fundamental frequency of the input audio signal using a maximum cross-correlation value between the low-pass filtered audio signal and the delayed audio signal.

* * * * *